(12) United States Patent
Photiadis et al.

(10) Patent No.: US 6,861,914 B2
(45) Date of Patent: Mar. 1, 2005

(54) MONOLITHIC VIBRATION ISOLATION AND AN ULTRA-HIGH Q MECHANICAL RESONATOR

(75) Inventors: Douglas Photiadis, Falls Church, VA (US); Angie Sarkissian, Olney, MD (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 52 days.

(21) Appl. No.: 10/259,860

(22) Filed: Sep. 30, 2002

(65) Prior Publication Data
US 2004/0061564 A1 Apr. 1, 2004

(51) Int. Cl.[7] ............................. H03B 5/30; H03H 9/00; H03H 9/24
(52) U.S. Cl. ........................ 331/156; 331/175; 333/200
(58) Field of Search ..................... 331/69, 70, 116 R, 331/116 FE, 116 M, 154, 156, 175, 187; 333/200

(56) References Cited

U.S. PATENT DOCUMENTS 5,959,516 A * 9/1999 Chang et al. ................. 334/14

* cited by examiner

*Primary Examiner*—David Mis
(74) *Attorney, Agent, or Firm*—John J. Karasek; John Gladstone Mills, III

(57) ABSTRACT

A mechanical oscillator is provided for use in micro-electromechanical systems (MEMS) for application in radio frequency filters and oscillators, motion and pressure sensors and other micro applications. The oscillator is of monolithic construction and has a high Q with little energy loss because of teeth attached to the oscillating member which contain energy and prevent losses.

13 Claims, 6 Drawing Sheets

MONOLITHIC VIBRATION ISOLATION AND AN ULTRA-HIGH Q MECHANICAL RESONATOR

BACKGROUND OF THE INVENTION

1. Field of the Invention

This invention relates generally to a mechanical oscillator in a micro-electromechanical system (MEMS), which is of particular interest in radio frequency filters and oscillators, motion and pressure sensors, and charge detectors, chemical sensors, magnetic resonance force microscopes, and torque magnetometers. Mechanical oscillators within these devices are most often the central component. The instant invention is a high Q monolithic mechanical oscillator with ultra high sensitivity and ultra low energy consumption.

2. Description of the Related Prior Art

Mechanical oscillators based on silicon nanofabrication technology are used in a variety of applications including sensor devices (See R. D. Biggar and J. M. Parpia, "High-Q Oscillator Torque Magnetometer," Rev. Sci. Instr. Vol. 69, 10, October 1998, 3558–3562 and See A. N. Cleland and M. L. Roukes, "Nanometerscale Mechanical Electrometer," Nature, Vo. 392, Mar. 12, 1996, pp. 160–162.) In order to develop better micro mechanical oscillator systems, it is necessary to control the flow of mechanical energy out of the oscillator into the surroundings in order to increase the quality factor of the oscillator (Q) and to control the coupling of the oscillator to other devices. Very high Q's have been achieved for some modes of double paddle oscillators (See Kleinman et al., "Single Crystal Silicon High-Q Torsional Oscillators," Rev. Sci Instrum. Vol. 56, pp 2088–2091, 1985.) The highest reported Q of about $2 \times 10^9$ is measured for a silicon oscillator at 3.5 K at a frequency of 5.1 kHz. The inverse Q or damping factor has been shown to increase as the temparture is raised above 20 K (See D. F. McGuigan et al., "Measurements of the Mechanical Q of Single Crystal Silicon at Low Temperatures," J.Low Temp. Phys., Vol. 30, pp 621–629. Energy losses remain a problem in these prior art systems especially when the oscillator is fabricated from a single substrate material and is of monolithic construction.

SUMMARY OF THE INVENTION

An object of the invention is to provide a mechanical oscillator with a high Q and ultra high sensitivity.

Another object of the invention is to provide a mechanical oscillator with ultra low energy consumption.

Another object of the invention is to provide a mechanical oscillator with high force sensitivity and low heat capacity.

Another object of the invention is to provide an oscillator that is easy to implement with nanofabrication technology.

Another object of the invention is to provide an oscillator that can be employed in a significant number of oscillator designs including both torsional and flexural devices.

Another object of the invention is to provide a technique whereby both damping and coupling of micro-electromechanical (MEMS) oscillators can be controlled by using teeth or fingers to contain energy losses in the oscillator system.

DESCRIPTION OF THE PREFERRED EMBODIMENT

The invention is an oscillator device which enables nearly complete vibration isolation of a mechanical element from its surroundings. This isolation may then be exploited to achieve a highly tuned mechanical resonator with a quality factor Q limited only by internal losses.

Figure 1:
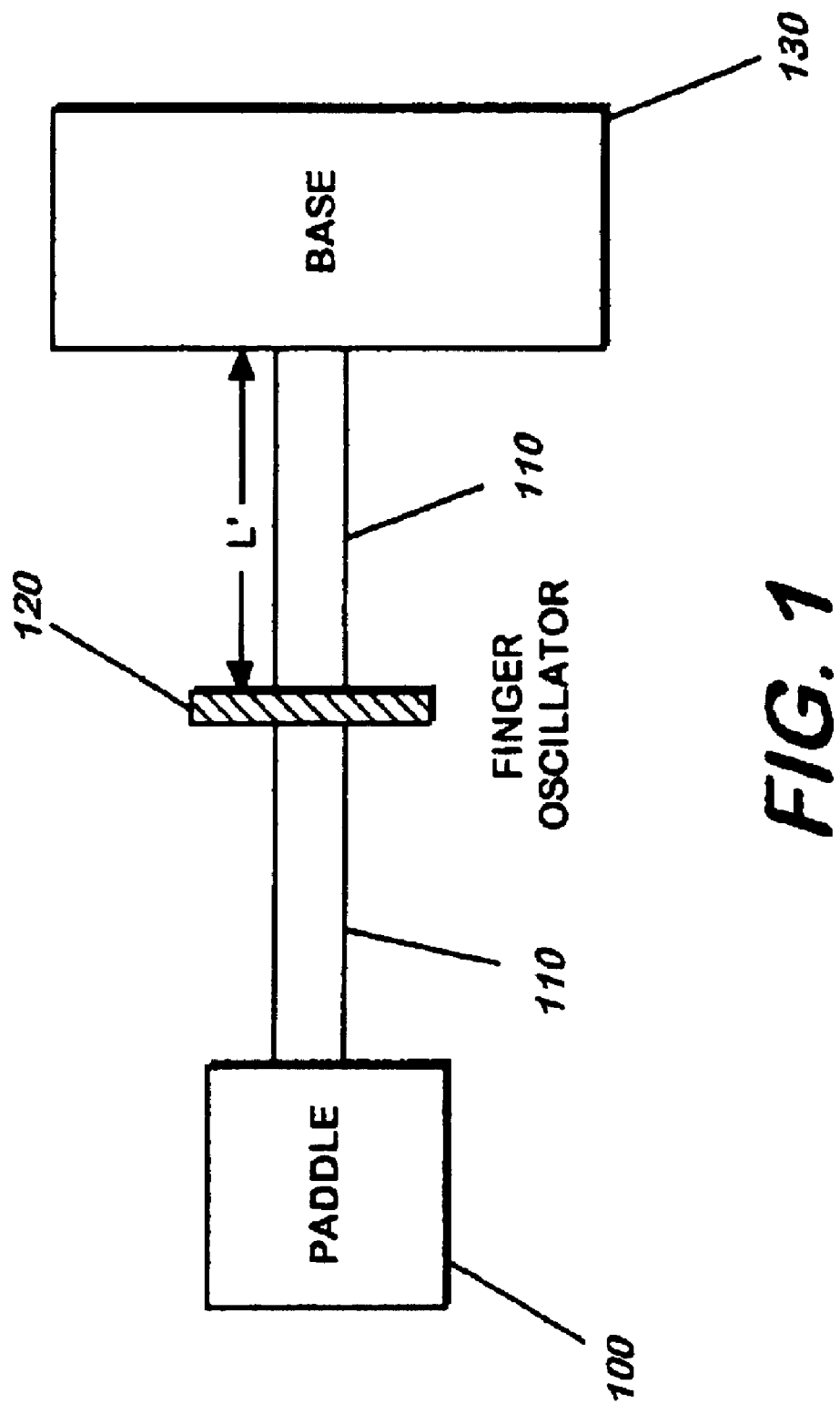
FIG. 1 shows a schematic diagram of the oscillator

A schematic diagram of the general implementation of the invention is shown in FIG. 1. The oscillating element 100, effectively consisting near resonance of a simple spring-mass system, is attached to the base 130 by a supporting member 110. The supporting member, 110, may or may not be required to provide significant stiffness to the oscillating element 100. The supporting member 110 is in turn attached to the outside environment through the base 130. The resonant isolating system 120 is inserted into the supporting member 110. Near resonance of 100, the isolating system provides any needed restoring force by its internal motion and greatly reduces the restoring force required by the base 130. This in turn reduces the reaction force of the entire oscillating system on the base 130 and therefore reduces the energy transmitted to the base 130.

Figure 2:
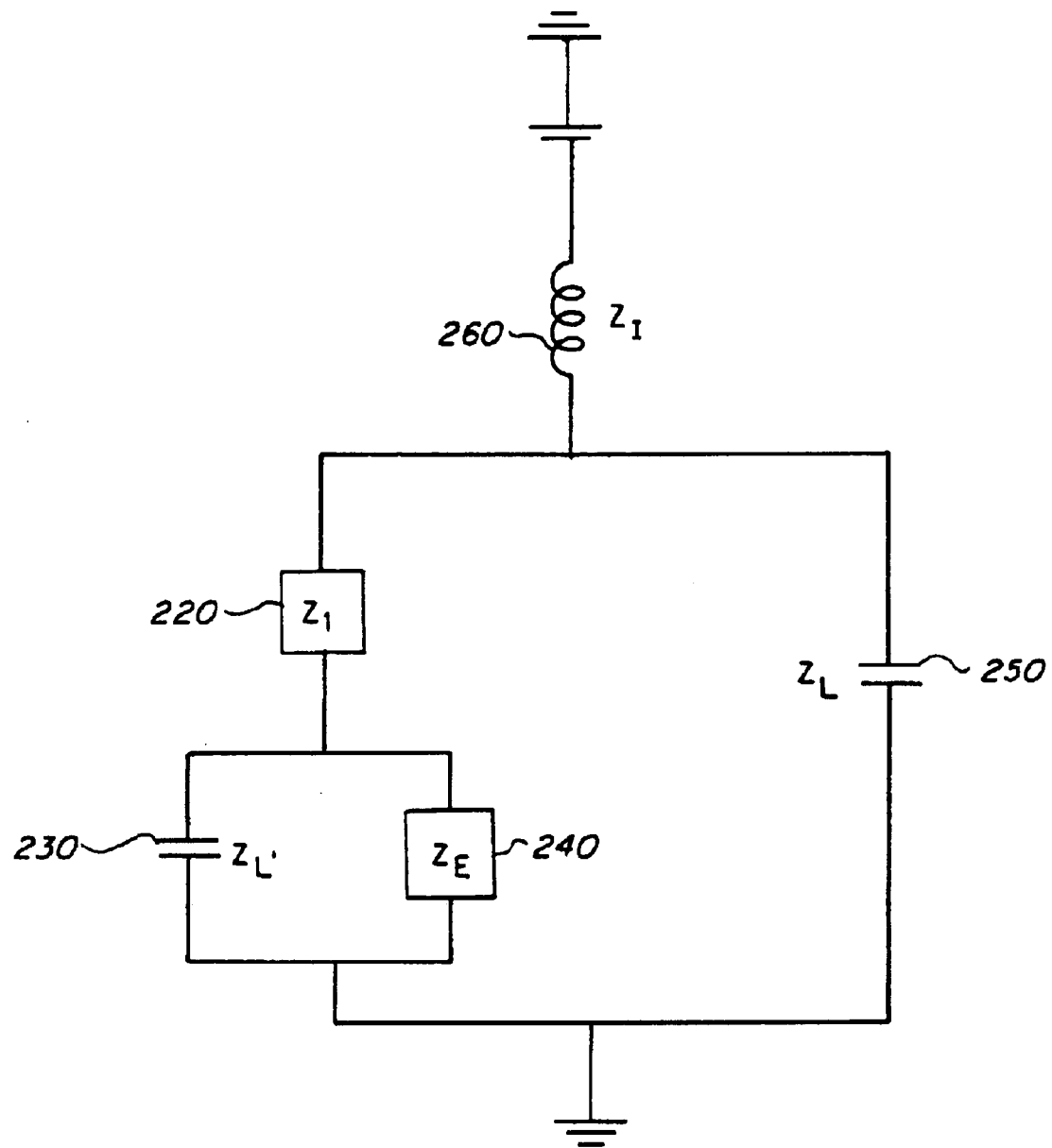
FIG. 2 shows a schematic diagram of the circuit analog for a mechanical oscillator

The circuit diagram of FIG. 2 shows the equivalent electric circuit of the simple torsional case of the invention. The elements 230 and 240, the supporting element closest to the base and the base itself, are mechanically in series. Together these elements are mechanically in parallel with the isolating system 220. This entire group, 220, 230 and 240, is mechanically in series with 250, the supporting element closest to oscillator 210. In this way the mechanical impedance of the system to a torque applied to 210 may be inferred.

The invention reduces loss based on attaching one or more resonant scatterers that couple to the dominant propagating mode of the supporting member, typically a fairly pure torsional, flexural, or longitudinal wave. The scatterers are realized in this case as 'teeth' fabricated monolithically with the oscillator, and thus involve only a modification of the mask and introduce no additional fabrication difficulty. The 'teeth' may be fingers or projections or extensions from the member which will function as an oscillator. A particular scatterer will give rise to a simple one dimensional scattering event to leading order, in which an incident propagating mode along the member from the oscillator (the paddle) is partially reflected and partially transmitted at the scatterer. Near an anti-resonance frequency of the scatterer, the transmission coefficient of the mode will vanish, thus eliminating energy flow along the member the beam and eliminating attachment loss as a damping mechanism.

Figure 3:
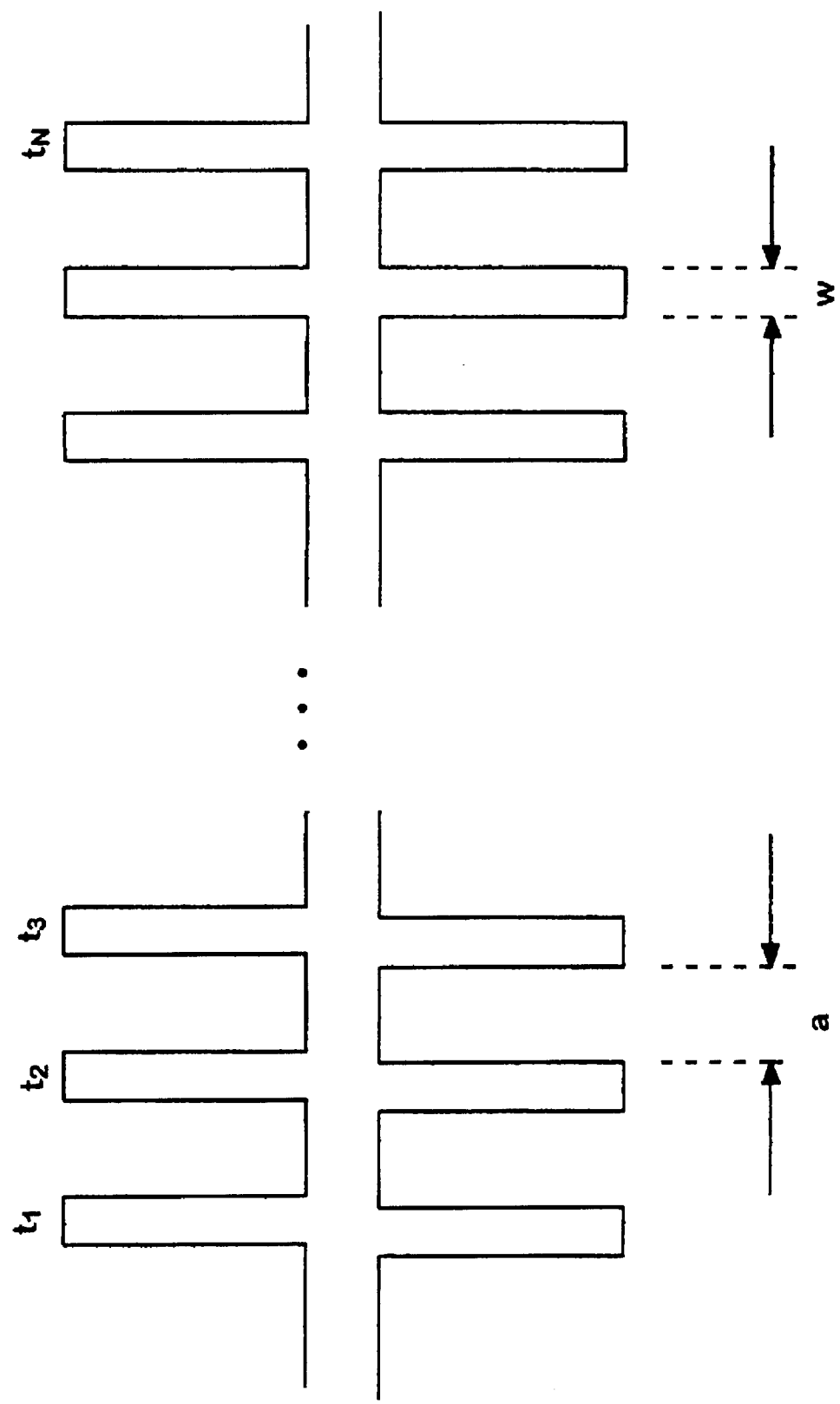
FIG. 3 shows a schematic diagram of the teeth used for containing energy in the oscillator

The novel feature of the invention is a coupling element with an attached array of teeth or fingers as shown in FIG. 3. The coupling element may be a beam, plate, or wire. On the coupling element is attached an array of teeth as shown in FIG. 3. The teeth play the role of a resonant array of oscillators attached to the supporting member. At frequencies near their anti-resonance, the operating range, the impedance of a single tooth becomes approximately that of an oscillator driven on its spring, and becomes very large compared to the other impedances in the system. In particular the impedance becomes much larger than the impedance of the supporting member and hence isolates the attached oscillator from the base, because these two elements are mechanically in parallel as shown in FIG. 2, elements 220 and 230. An array of teeth or fingers produces a more robust and broader band performance because of multiple scattering effects.

The length of the teeth l and the thickness of the structure h determine the frequencies of the flexural resonances of the teeth. The anti-resonance frequency of the fingers depends on the excitation, torsional or shear. Consider first the torsional case with the fingers arranged symmetrically about the coupling element as shown in FIG. 3. By symmetry the displacement of the fingers at the attachment point vanishes and the rotation of the element applies a torque to the fingers. Choosing the length of a finger according to the equation $l=1.875(c_f/\omega)$, where $c_f$ is the speed of the wave and $\omega$ is the desired frequency, the fingers will exhibit an anti-resonance at frequency $\omega=\omega_0$. Variations from this prescribed equation may be necessary because of variations in material or geometry which disturb the symmetry of the device. With the material parameters m=mass/area, and D the flexural rigidity of the teeth, $C_f$ is the speed of the flexural waves in a beam or rod and is defined as $c_f=(D/m)^{1/4}\omega^{1/2}$. The invention results in no coupling of energy along the length of the element C because of a vanishing transmission coefficient t according to the formula $t=2Z/(2Z+Z_0)$ because $Z_0$, the input impedance of a single tooth, tends to infinity near $\omega_0$. Here Z is the wave impedance of the supporting member.

A more robust and more broad band reduction in the attachment loss of the system is achieved by using multiple oscillators attached to the wire; i.e. an array of teeth. The simplest approach involves the use of teeth of identical length. Assume an infinite, periodic array of scatterers attached to the wavebearing medium of the wire for the purposes of examining array effects most easily. In this case we may immediately write down the solution for the Floquet or Bloch wavenumber k of the solutions, $$\cos k_\alpha = \cos(k_f\alpha+\phi)/|t|$$

where $\alpha$ is the spacing between the fingers, $k_f=\omega/c_f$, $c_f$ is the speed of torsional waves on the wire, and the single scatterer transmission coefficient for a torsional wave incident on a single scatterer is a $t=/t/e^{i\phi}$. Here the transmission coefficient is given by $t=2Z/(2Z+Z_0)$ as noted above, and vanishes at the anti-resonance frequency of the scatterer. Within this physical description, isolation of the paddle is given by the attenuation $\alpha=\text{Im}(k)$.

Another approach based on arrays involves using teeth of varying length. The anti-resonance frequencies will then vary according to $\omega_i=1.875(c_f/l_i)$ with $l_i$ the length of the ith finger. The frequencies at which the array will be effective will thus be spread in the range $(\omega_1, \ldots \omega_n)$ with n fingers and provided there is sufficient frequency overlap, isolation will be achieved over the entire range.

Figure 4:
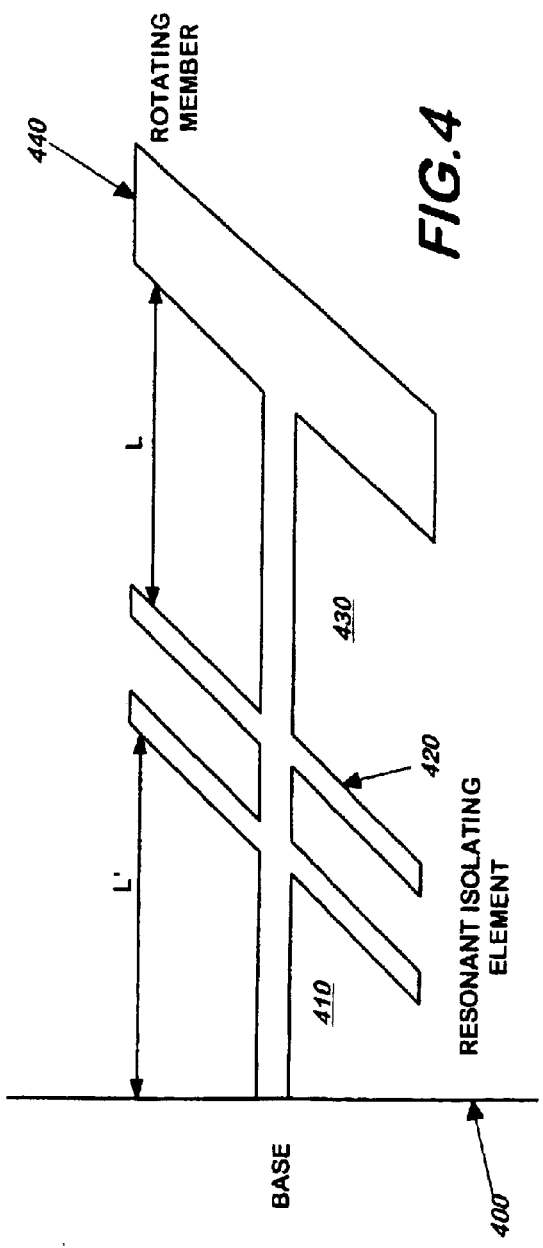
FIG. 4 shows a schematic of a torsional case paddle oscillator
Figure 5:
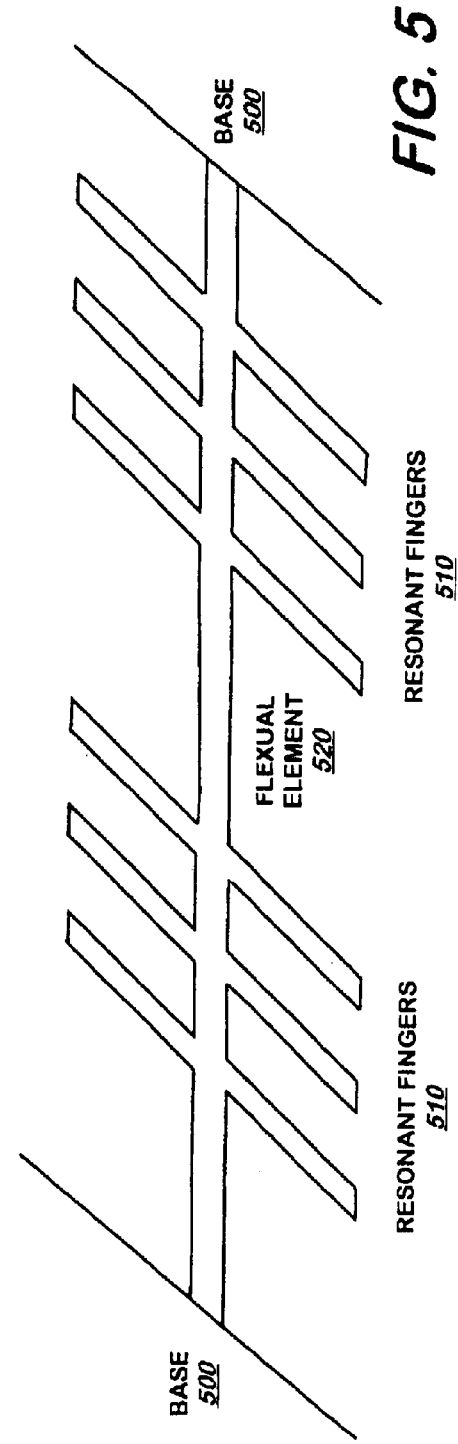
FIG. 5 shows a schematic of a flexural case oscillator

Two examples of the implementation of the improved mechanical oscillator are shown in FIG. 4 and FIG. 5.

FIG. 4 shows a schematic block diagram of a single paddle torsional example. The rotating member 440 is driven into oscillation with the torsional stiffness provided by the neck 430. The dynamic response of the finger array 420 ensures that 430 is fixed at one end and that very small torques are transmitted to the foot 410. In this way very little energy is transmitted to the base 400 and subsequently lost.

FIG. 5 shows a two-sided flexural example. In this figure, the oscillating member is a simple beam, the element 520, in flexure. The lengths of the fingers 510 can be adjusted to suppress translational rather than rotational motion, and hence to prevent the transmission of flexural vibration to the base 500.

Figure 6:
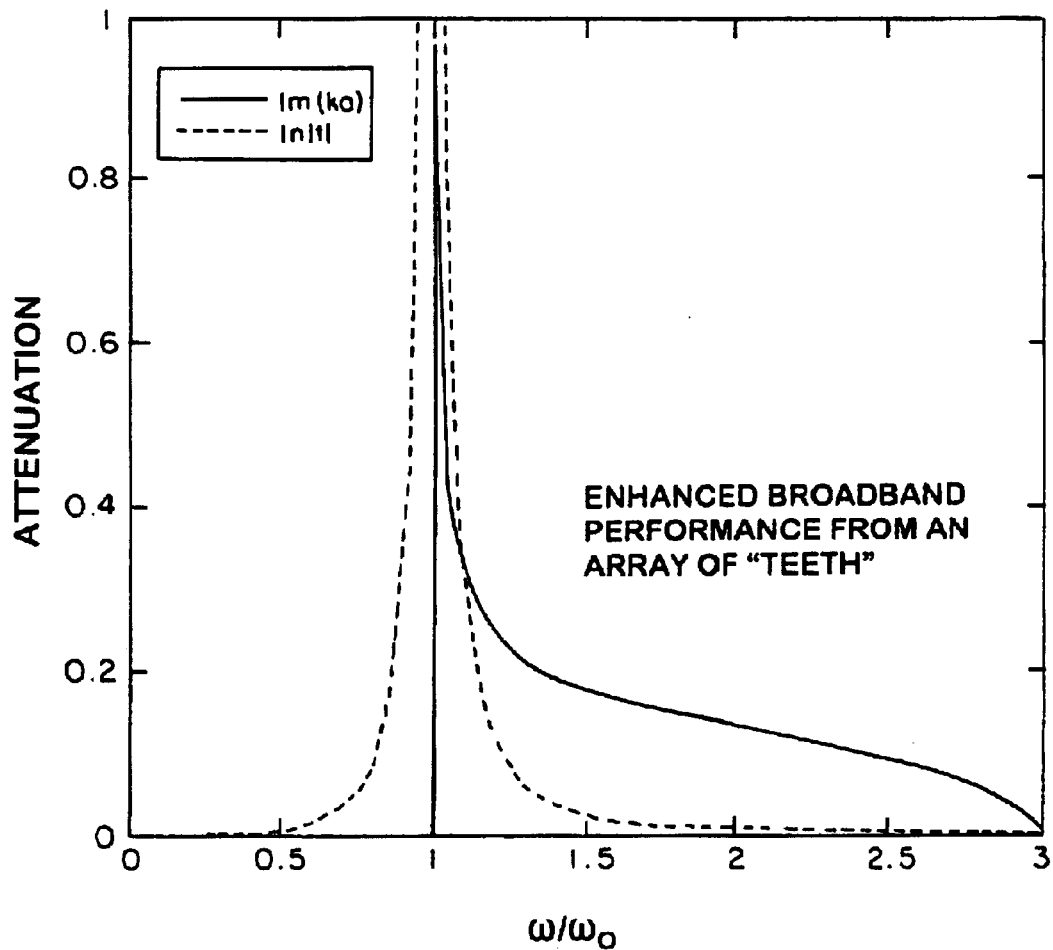
FIG. 6 shows a graph of the performance of the improved oscillator

The predicted performance of the oscillator with the teeth array according to this simple model discussed above is shown in FIG. 6. Here attenuation is plotted against frequency. The attenuation has a broader frequency band over which it is effective with the implementation of the teeth array. This provides a measure of the attenuation provided by a group of isolating elements if they act incoherently, without multiple scattering effects. The attenuation directly calculated for a coherent array exhibits similar high performance very near the anti-resonance frequency $\omega_0$, but in addition produces significant performance over a fairly broad band of at least an octave above the anti-resonance frequency $\omega_0$. This reasonably broad frequency band performance indicates that the devices do not have to be finely tuned in order to achieve significant benefit, an important aspect for the exploitation of this concept in MEMS/NEMS devices.

Figure 7A:
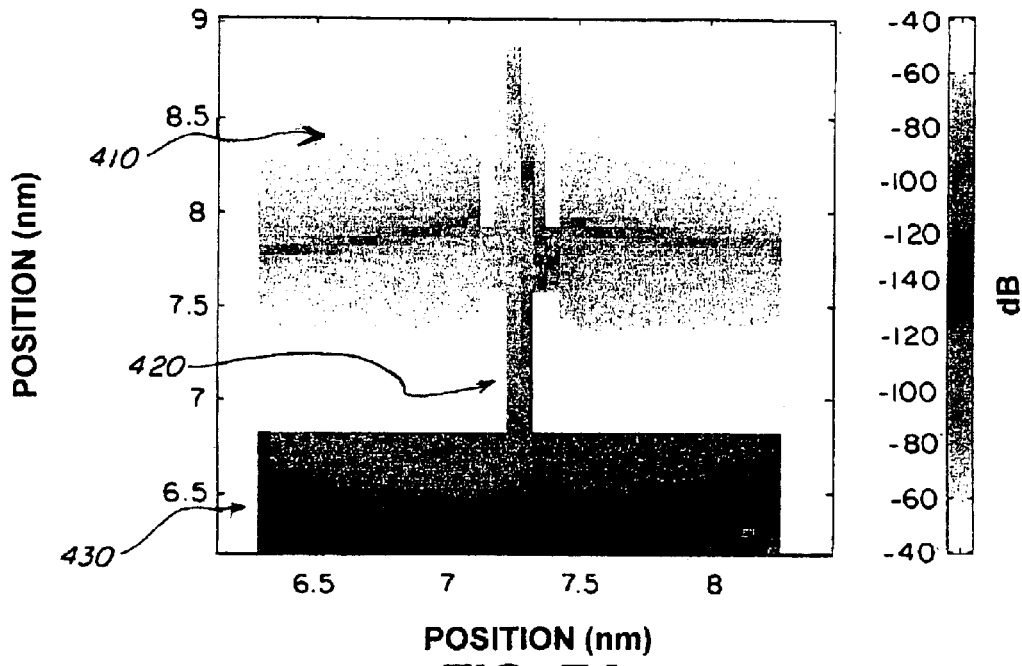
FIG. 7a shows the Laser Doppler Vibration Mapping of a paddle oscillator without fingers.
Figure 7B:
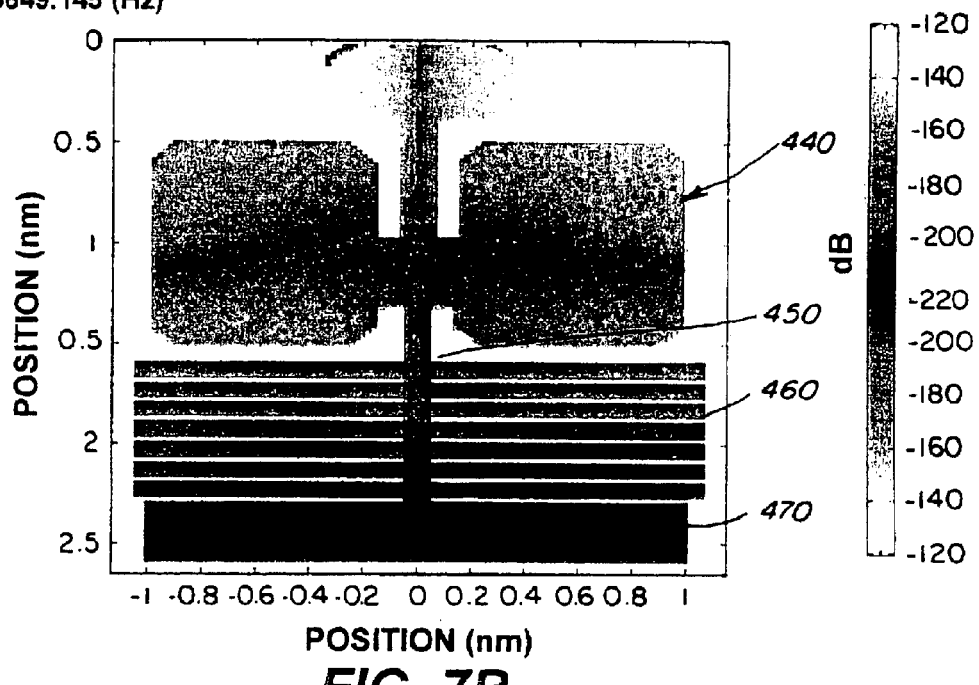
FIG. 7b shows the Laser Doppler Vibration Mapping of a paddle oscillator with fingers.

Another measure of the performance of the mechanical oscillator of the invention is the laser Doppler vibrometry (LDV) image of the resonant motion of a high Q double paddle oscillator. FIG. 7a shows the displacement at the base of a double paddle oscillator (DPO) without fingers. The vibrometry dipole pattern at the base indicates that radiation of vibrational energy and related losses continues to occur with an oscillator without teeth or fingers. FIG. 7b shows the corresponding results with the finger array showing that there are essentially no vibrational energy or related losses. The plot shows motion at the top of the finger array, the desired anti-resonant response, and a significant decay of the response as we move our examination towards the base. At the base itself, no motion was detectable within the noise floor of these measurements. The Q of the oscillator was indeed improved by the modification at low temperatures; at room temperature other mechanisms prevent high performance silicon oscillators from being achievable.

Although this invention has been described in relation to an exemplary embodiment thereof, it will be understood by those skilled in the art that still other variations and modifications can be affected in the preferred embodiment without detracting from the scope and spirit of the invention as described in the claims.

What is claimed:

1. A mechanical oscillator for a micro-electromechanical system comprising:

a torsional member displaced around an axis;

a connecting arm jointed to said torsional member and joined to a stationary base;

teeth connected to and projecting from said connecting arm for reflecting energy lost from said torsional member when said member is displaced.

2. The mechanical oscillator of claim 1, wherein said torsional member is a paddle.

3. The mechanical oscillator of claim 1, wherein said oscillator is of monolithic construction.

4. The mechanical oscillator of claim 1, wherein the length l of said teeth can be determined by the equation $l=1.875(c_f/\omega)$, where $c_f$ is the speed of the wave and $\omega$ is the desired frequency.

5. The mechanical oscillator of claim 1, wherein the frequency band of said oscillator may be increased by varying the length of teeth in an array of teeth attached to said torsional member.

6. The mechanical oscillator of claim 1, wherein said teeth are fingers.

7. A mechanical oscillator for a micro-electromechanical system comprising:
- a vibrating flexural member;
- a connecting arm jointed to said flexural member and joined to a stationary base;
- teeth connected to and projecting from said connecting arm for reflecting energy radiated from said flexural member when said member is displaced.

8. The mechanical oscillator of claim 7, wherein said flexural member is a planar material.

9. The mechanical oscillator of claim 7, wherein said oscillator is of monolithic construction.

10. The mechanical oscillator of claim 7, wherein the length l of said teeth can be determined by the equation $l=1.875(c_f/\omega)$, where $c_f$ is the speed of the wave and $\omega$ is the desired frequency.

11. The mechanical oscillator of claim 7, wherein the frequency band of said oscillator may be increased by varying the length of teeth in an array of teeth attached to said flexural member.

12. The mechanical oscillator of claim 7, wherein said teeth are fingers.

13. A method of monolithic vibration isolation in a micro-electromechanical system comprising the steps of
- applying a force to a member capable of flexing or torquing said member;
- damping said force; and
- reflecting energy within said member by means of teeth attached to said member.

* * * * *